US010600862B2

(12) United States Patent
Griebl et al.

(10) Patent No.: US 10,600,862 B2
(45) Date of Patent: Mar. 24, 2020

(54) HIGH VOLTAGE TERMINATION STRUCTURE OF A POWER SEMICONDUCTOR DEVICE

(71) Applicant: Infineon Technologies Austria AG, Villach (AT)

(72) Inventors: Erich Griebl, Dorfen (DE); Frank Wolter, Munich (DE); Andreas Moser, Maria-Rain (AT); Manfred Pfaffenlehner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/791,943

(22) Filed: Oct. 24, 2017

(65) Prior Publication Data
US 2018/0114830 A1    Apr. 26, 2018

(30) Foreign Application Priority Data
Oct. 25, 2016  (DE) .......................... 10 2016 120 300

(51) Int. Cl.
*H01L 29/06*       (2006.01)
*H01L 29/78*       (2006.01)
(Continued)

(52) U.S. Cl.
CPC ........ *H01L 29/0623* (2013.01); *H01L 21/761* (2013.01); *H01L 21/765* (2013.01);
(Continued)

(58) Field of Classification Search
CPC ............. H01L 29/0623; H01L 29/7813; H01L 29/405; H01L 29/402; H01L 29/0615;
(Continued)

(56) References Cited

U.S. PATENT DOCUMENTS 4,707,719 A * 11/1987 Whight ............... H01L 29/0619
257/489
7,772,669 B2    8/2010 Tool et al.

FOREIGN PATENT DOCUMENTS

| CA | 963174 A | 5/1975 |
|---|---|---|
| DE | 2231521 A | 1/1973 |

(Continued)

*Primary Examiner* — Laura M Menz
*Assistant Examiner* — Candice Chan
(74) *Attorney, Agent, or Firm* — Murphy, Bilak & Homiller, PLLC

(57) ABSTRACT

A power semiconductor device includes a semiconductor body coupled to first and second load terminals and including a drift region with dopants of a first conductivity type. An active region has at least one power cell extending at least partially into the semiconductor body, is electrically connected with the first load terminal and includes a part of the drift region. Each power cell includes a section of the drift region and is configured to conduct a load current between the terminals and to block a blocking voltage applied between the terminals. A chip edge laterally terminates the semiconductor body. A non-active termination structure arranged in between the chip edge and active region includes an ohmic layer. The ohmic layer is arranged above a surface of the semiconductor body, forms an ohmic connection between electrical potentials of the first and second load terminals, and is laterally structured along the ohmic connection.

20 Claims, 12 Drawing Sheets

(51) Int. Cl.
*H01L 29/40* (2006.01)
*H01L 21/761* (2006.01)
*H01L 21/765* (2006.01)
H01L 29/739 (2006.01)
H01L 29/417 (2006.01)
H01L 29/861 (2006.01)

(52) U.S. Cl.
CPC .......... *H01L 29/402* (2013.01); *H01L 29/405* (2013.01); *H01L 29/7813* (2013.01); H01L 29/0615 (2013.01); H01L 29/0638 (2013.01); H01L 29/41766 (2013.01); H01L 29/7395 (2013.01); H01L 29/7397 (2013.01); H01L 29/7811 (2013.01); H01L 29/861 (2013.01)

(58) Field of Classification Search
CPC ........... H01L 29/7397; H01L 29/41766; H01L 29/861; H01L 29/7395; H01L 29/0638; H01L 29/7811; H01L 21/765; H01L 21/761
See application file for complete search history.

(56) References Cited

FOREIGN PATENT DOCUMENTS

| | | |
|---|---|---|
| DE | 102006056139 A1 | 12/2007 |
| JP | H10163482 A | 6/1998 |
| JP | 2003008009 A | 1/2003 |

\* cited by examiner

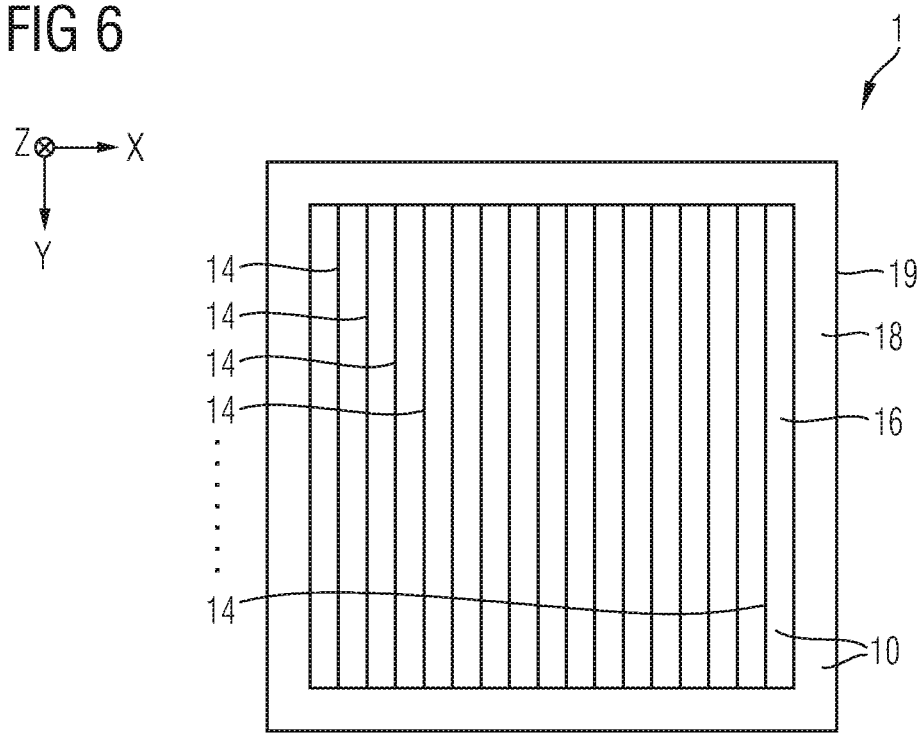
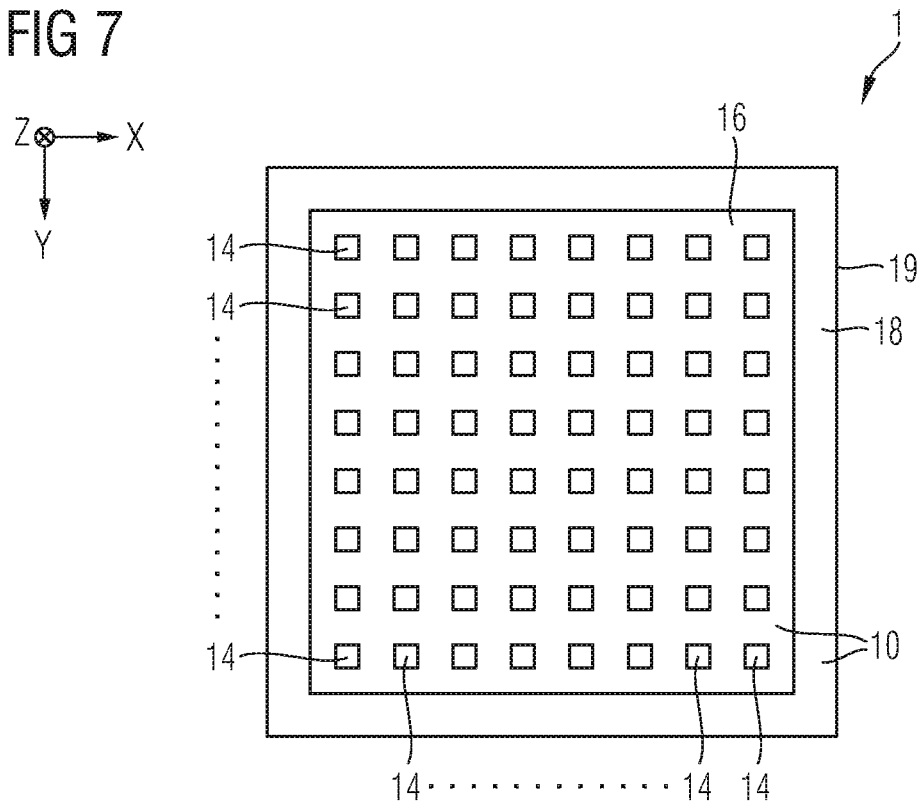

HIGH VOLTAGE TERMINATION STRUCTURE OF A POWER SEMICONDUCTOR DEVICE

TECHNICAL FIELD

This specification refers to embodiments of a power semiconductor device and to embodiments of a method of processing a power semiconductor device. In particular, this specification relates to embodiments of a high voltage termination structure of a power semiconductor device and to embodiments of a method of processing such a high voltage termination structure.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs). Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Further, for conducting the load current, the power semiconductor device may comprise one or more power cells which may be arranged in a so-called active region of the power semiconductor device. The power semiconductor device may be laterally confined by a chip edge, and between the chip edge and the active region that comprises the one or more power cells, there may be arranged a termination structure.

In terms of power semiconductor devices, such a termination structure is also referred to as a "high voltage termination structure", and it may serve the purpose of influencing the course of the electric field within the semiconductor body, e.g., so as to ensure reliable blocking capability of the power semiconductor device. To this end, the termination structure may comprise one or more components arranged within the semiconductor body, and also one or more components arranged above a surface of the semiconductor body.

For example, a termination structure may comprise an ohmic layer that connects the electrical potential of the first load terminal with the electrical potential of the second load terminal. For example, this may allow for symmetrizing an electric field, at least within that section of the semiconductor body that forms a part of the termination structure.

SUMMARY

According to an embodiment, a power semiconductor device comprises: a semiconductor body coupled to a first load terminal and a second load terminal and including a drift region with dopants of a first conductivity type; an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals; a chip edge that laterally terminates the semiconductor body; a non-active termination structure arranged in between the chip edge and the active region and comprising an ohmic layer. The non-active termination structure further comprises a first semiconductor region and a second semiconductor region, each comprising dopants of a second conductivity type, wherein the first semiconductor region is electrically connected to the first load terminal and laterally overlaps therewith. The ohmic layer is arranged above a surface of the semiconductor body. The ohmic layer forms an ohmic connection between an electrical potential of the first load terminal and an electrical potential of the second load terminal. The ohmic layer is laterally structured along the ohmic connection. Further, the ohmic layer is made of amorphous silicon or semi-insulating polycrystalline silicon and laterally overlaps with the second semiconductor region.

According to another embodiment, a power semiconductor device comprises: a semiconductor body coupled to a first load terminal and a second load terminal and including a drift region with dopants of a first conductivity type; an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals, and wherein the at least one power cell comprises a control electrode electrically insulated from each of the load terminal and configured to control operation of the at least one power cell; a chip edge that laterally terminates the semiconductor body; a non-active termination structure arranged in between the chip edge and the active region and comprising an ohmic layer. The non-active termination structure further comprises a first semiconductor region and a second semiconductor region, each comprising dopants of a second conductivity type, wherein the first semiconductor region is electrically connected to the first load terminal and laterally overlaps therewith. The ohmic layer is arranged above a surface of the semiconductor body. The ohmic layer forms an ohmic connection between an electrical potential of the second load terminal and an electrical potential of the control electrode. The ohmic layer is laterally structured along the ohmic connection. Further, the ohmic layer is made of amorphous silicon or semi-insulating polycrystalline silicon and laterally overlaps with the second semiconductor region.

According to further embodiment, a method of processing a power semiconductor device is presented. The processed power semiconductor device comprises a semiconductor body coupled to a first load terminal and a second load terminal and including a drift region with dopants of a first conductivity type; an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals; a chip edge that laterally terminates the semiconductor body; and a non-active termination structure arranged in between the chip edge and the active region. The non-active termination structure comprises a first semiconductor region and a second semiconductor region, each comprising dopants of a second conductivity type, wherein the first semiconductor region is electrically connected to the first load terminal and laterally overlaps therewith. The method comprises: creating, above a surface of the semiconductor body, an ohmic layer in the termination structure, thereby forming an ohmic connection between an electrical potential of the first load terminal and an electrical potential of the second load terminal, wherein forming the ohmic layer includes structuring the ohmic layer along the ohmic connection. The ohmic layer is made of amorphous silicon or semi-insulating polycrystalline silicon and laterally overlaps with the second semiconductor region According to a yet further embodiment, a method of processing a power semiconductor device is presented. The power semiconductor device comprises a semiconductor body coupled to a first load terminal and a second load terminal and including a drift region with dopants of a first conductivity type; an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals, wherein the at least one power cell comprises a control electrode electrically insulated from each of the load terminal and configured to control operation of the at least one power cell; a chip edge that laterally terminates the semiconductor body; and a non-active termination structure arranged in between the chip edge and the active region. The non-active termination structure comprises a first semiconductor region and a second semiconductor region, each comprising dopants of a second conductivity type, wherein the first semiconductor region is electrically connected to the first load terminal and laterally overlaps therewith. The method comprises: creating, above a surface of the semiconductor body, an ohmic layer in the termination structure, thereby forming an ohmic connection between an electrical potential of the control electrode and an electrical potential of the second load terminal, wherein forming the ohmic layer includes structuring the ohmic layer along the ohmic connection. The ohmic layer is made of amorphous silicon or semi-insulating polycrystalline silicon and laterally overlaps with the second semiconductor region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 6-7 each schematically and exemplarily illustrate a section of a horizontal projection of a power semiconductor device in accordance with one or more embodiments.

DETAILED DESCRIPTION

Figure 1:
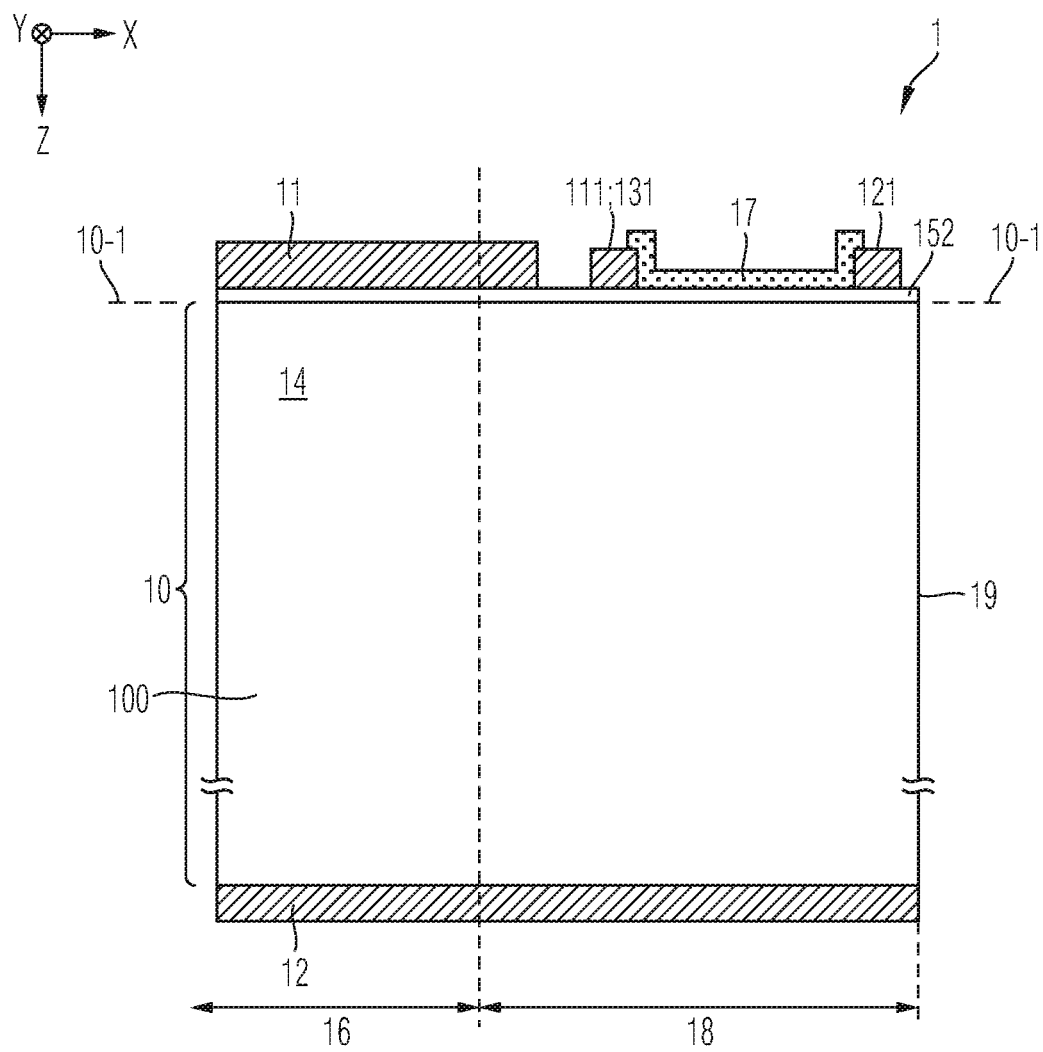
FIGS. 1-5 each schematically and exemplarily illustrate a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in electric contact", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no electric connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or cellular configuration, such as a power semiconductor transistor or power semiconductor diode that may be used within a power converter or a power supply. Thus, in an embodiment, the semiconductor device is configured to carry a load current that is to be fed to a load and/or, respectively, that is provided by a power source. For example, the semiconductor device may comprise one or more active power cells, such as a monolithically integrated diode cell, and/or a monolithically integrated transistor cell, and/or a monolithically integrated IGBT cell, and/or an IGBT with a monolithically integrated reverse conducting diode (RC-IGBT) cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere or even up to some kA, and/or high voltages, typically above 15 V, more typically 100 V and above, e.g., up to at least 400 V, up to at least one or more kV. For example, the processed semiconductor device described below may be a semiconductor device exhibiting a stripe cell configuration or a polygonal/needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily illustrates a section of a vertical cross-section of the power semiconductor device 1 in accordance with one or more embodiments. The illustrated cross-section is in parallel to plane defined by the first lateral direction X and the extension direction Z, wherein the extension direction Z may be a vertical direction. Each of the illustrated components may extend along the second lateral direction Y.

The power semiconductor device 1 comprises a semiconductor body 10 that is coupled to each of the first load terminal 11 and a second load terminal 12. For example, the semiconductor body 10 is based on a semiconductor material comprising silicon or silicon carbide or Gallium nitride (GaN).

For example, the first load terminal 11 may comprise at least one of a source/emitter terminal of a power transistor and a anode terminal of a power diode, and may be, e.g., arranged on a frontside of the power semiconductor device 1. Further, the first load terminal 11 may be implemented by means of a front side metallization.

Further, the second load terminal 12 may comprise at least one of a collector terminal, a drain terminal and an cathode terminal, e.g., arranged on a backside of the power semiconductor device 1. Further, the second load terminal 12 may be implemented by means of the back side metallization. Thus, in an embodiment, the first load terminal 11 and the second load terminal 12 may vertically terminate the power semiconductor device 1.

The semiconductor body 10 comprises a drift region 100 that has dopants of the first conductivity type. In an embodiment, the drift region 100 is an n-doped region. For example, both the dopant concentration and the total extension of the drift region 100 along the extension direction Z may define the blocking capability, i.e., the blocking voltage of the power semiconductor device 1.

Now also referring to FIGS. 6-7, which each schematically and exemplarily illustrate a section of a horizontal projection of the power semiconductor device 1 in accordance with some embodiments, the drift region 100 may extend into each of an active region 16 and non-active termination structure 18 of the power semiconductor device 1.

For example, the active region 16 comprises one or more power cells 14 that each extent at least partially into the semiconductor body 10 and that may each be electrically connected with the first load terminal 11. In embodiment, the power semiconductor device comprises a large plurality of power cells 14, e.g., more than 100, more than 1000 or even more than 10,000. Each of the power cells 14 may be set up in an identical manner. Accordingly, the power cell 14 described below may be considered as a power unit cell. The following explanation may thus refer to every power cell 14 that may be included in the power semiconductor device 1.

Each of the one or more power cells 14 may comprise a part of the drift region 100. As illustrated in FIG. 6, the power cells 14 may exhibit a stripe configuration, which may extend, e.g., throughout the entire active region 16 along the second lateral direction Y. In another embodiment, as illustrated in FIG. 7, the power cells 14 may exhibit a cellular configuration, e.g., having a horizontal cross-section exhibiting one of a rectangular shape, a circular shape, and ellipsoidal shape, a rectangular shape with rounded corners. In yet another embodiment, the active region 16 comprises both power cells 14 in a stripe configuration and power cells 14 in a cellular configuration.

Each of the one or more power cells 14 that may be included in the active region 16 of the power semiconductor device 1 may be configured to conduct a respective share of the load current between the terminals 11 and 12, and to block a blocking voltage applied between the terminals 11 and 12.

The present specification is not limited to a specific kind of configuration of the power cells 14. Rather, the power cells 14 can exhibit any configuration that is common for a power semiconductor device, e.g., at least one of a diode configuration, a thyristor configuration, a MOS gated diode (MGD) configuration, a transistor configuration, e.g., an IGBT configuration, an RC IGBT configuration, a MOSFET configuration and a configuration derived therefrom. Further, the at least one power cell 14 may exhibit a compensation structure, which is also referred to as "superjunction" structure. The at least one power cell 14 can be configured for a specific blocking voltage, e.g., a blocking voltage of at least 100 V, of at least 300 V, or even of more than 500 V.

For example, in order to control the one or more power cells 14, a control terminal (not illustrated) can be provided that may be configured to forward a control signal to a control electrode structure of the one or more power cells 14. For example, the control terminal can be a gate terminal. Thereby, the power semiconductor device may be set in one of the conducting state and the blocking state. In an embodiment, such control signal can be provided by means of applying a voltage between the control terminal and the first load terminal 11.

The skilled person is acquainted with possible configurations of a power cell. Accordingly, in FIG. 1, the power cell 14 is only schematically illustrated, as the exact configuration is not a major subject of this specification.

Figure 2:
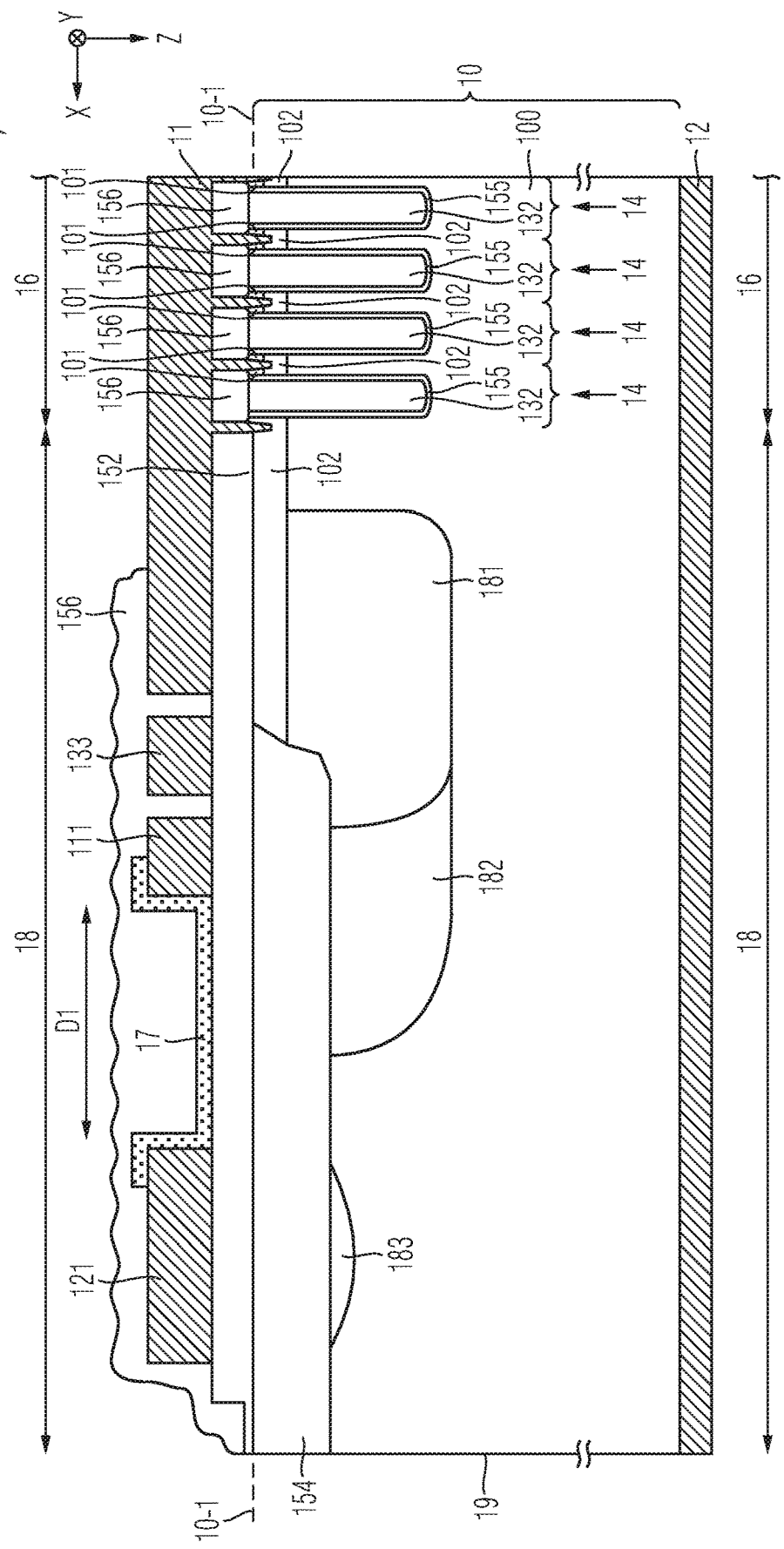
Figure 3:
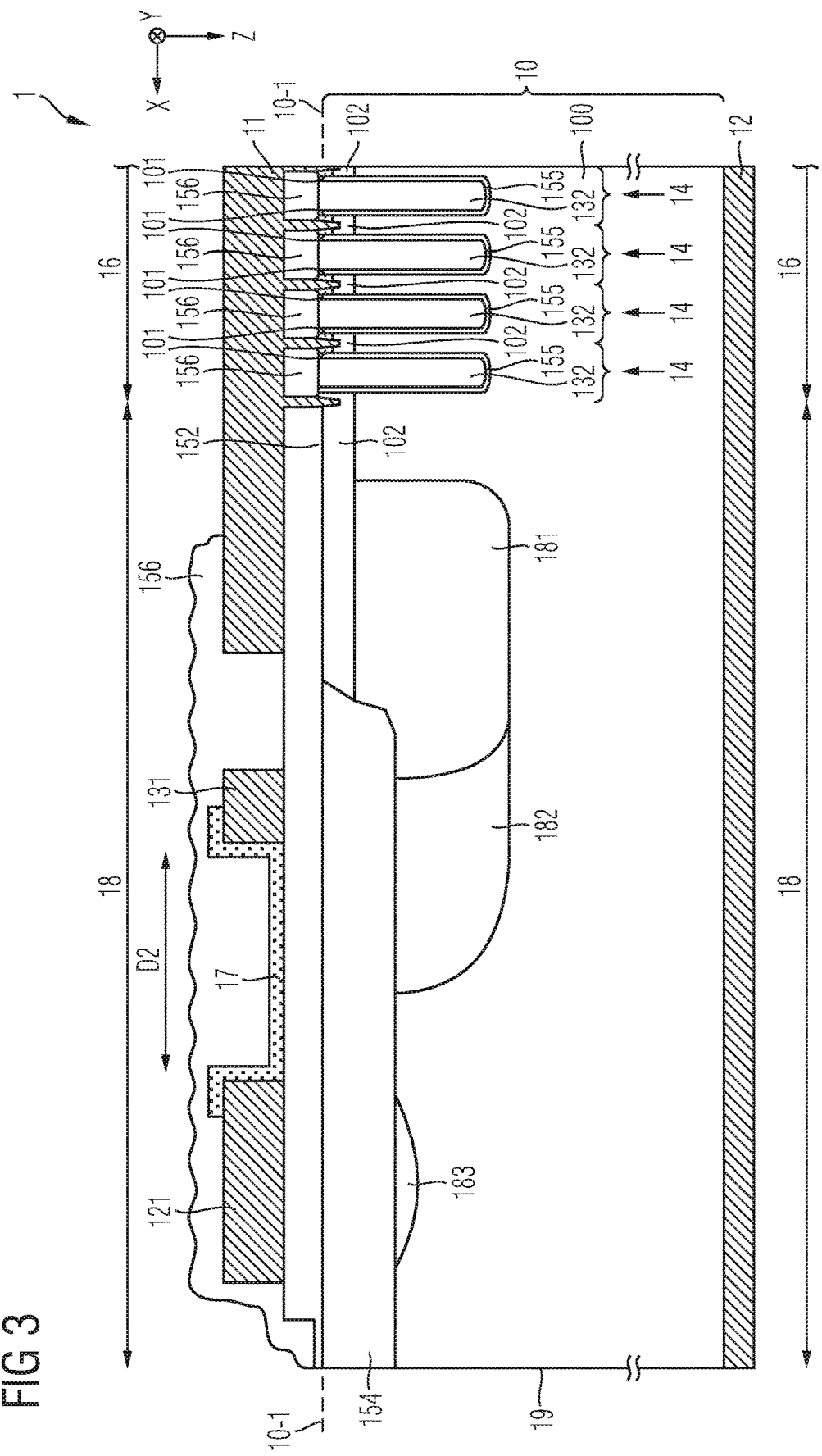

To give nevertheless just one non-limiting example of a possible set-up of the at least one power cell 14, it is referred to the exemplary embodiments in accordance with FIGS. 2-3, which each show a small section of the active region 16 including four power cells 14 exhibiting a trench configuration. For example, each power cell 14 may comprise a control electrode 132 that is electrically insulated from each of the first load terminal 11 and the second load terminal 12. The control electrodes 132 may be included in a respective trench and may be configured, upon receiving a corresponding control signal, e.g., upon being subjected to certain electrical potential, to induce an inversion channel in a semiconductor body region 102 having dopants of the second conductivity type complementary to the first conductivity type. The semiconductor body region 102 may extend into each power cell 14. Each power cell 14 may further include a respective semiconductor source region 101 having dopants of the first conductivity type, e.g., at the significantly higher dopant concentration as compared to the dopant concentration of the drift region 100 (sometimes also referred to as "n-source"). The source regions 101 may be isolated from the drift region 100 by means of the semiconductor body region 102. Each of the semiconductor source regions 101 and the semiconductor body region 102 may be electrically connected to the first load terminal 11. Accordingly, in an embodiment, each power cell 14 may include a pn-isolation, e.g., configured to withstand the blocking voltage.

However, as has already been pointed out above, the present specification is not limited to any specific configuration of the power cells 14, e.g., not limited to a trench configuration. For example, in another embodiment, power cells are provided that have control electrodes in a planar configuration, e.g., entirely arranged above the surface 10-1 of the semiconductor body 10.

The semiconductor body 10 may be laterally confined, e.g., in the first lateral direction X, in the second lateral direction Y and in a direction produced by an arbitrary combination of the two lateral directions X and Y, by a chip edge 19. In an embodiment, the chip edge 19 can come into being by means of wafer dicing, to give an example. For example, the chip edge 19 extends along the extension direction Z.

Between the chip edge 19 and the active region 16, there may be arranged the non-active termination structure 18, in the following also simply referred to as "termination structure 18". In an embodiment, the termination structure 18 entirely surrounds the active region 16, as schematically illustrated in FIGS. 6-7. Further, the termination structure 18 is not configured for conducting the load current between the load terminals 11 and 12, but rather configured to ensure reliable blocking capabilities of the power semiconductor device 1, in accordance with an embodiment. The termination structure 18 may be a high voltage termination structure 18. For example, at least the substantial part of the load current, e.g., more than 95% of the load current, is conducted by the active region 16, only.

The termination structure 18 may comprise one or more components arranged above the surface 10-1 of the semiconductor body 10, as well as one or more components forming a part of the semiconductor body 10. For example, as has already been explained above, the drift region 100 extends not only into the active region 16, but also forms a part of the semiconductor body 10 that belongs to the termination structure 18, in accordance with an embodiment. Further, on top of the surface 10-1, there may be arranged an isolation layer 152, e.g., an oxide layer.

For example, the termination structure 18 comprises an ohmic layer 17 that is arranged above the surface 10-1, e.g., above the isolation layer 152. The ohmic layer 17 may be made of an ohmic material, e.g., amorphous silicon (am-Si) or semi-insulating polycrystalline silicon (SIPOS) or the like. Further, the ohmic layer 17 can be configured to form, with respect to charge present in the semiconductor body 10 at least partially covered by the ohmic layer 17, a counter charge. For example, this may allow for symmetrizing an electric field, at least within that section of the semiconductor body 10 that forms a part of the termination structure 18.

For example, in an embodiment, the ohmic layer 17 may be configured to protect the power semiconductor device 1 from ion penetration, e.g., at sensitive areas.

Further, the ohmic layer 17 may be configured to form an ohmic connection between two electrical potentials. A first of these electrical potentials may be constituted by the electrical potential of the second load terminal 12. For example, the semiconductor device 1 comprises a second contact 121 arranged above the surface 10-1 and in the termination structure 18. The second contact 121 may be configured to provide the electrical potential of the second load terminal 12. Thus, in an embodiment, the electrical potential of the second load terminal 12 may be provided at the front side of the semiconductor device 1. The semiconductor device 1 may comprise an electrical connection (not illustrated) that electrically connects the second load terminal 12 with the second contact 121. Additionally or alternatively, in an embodiment, the second contact 121 may be in electrical contact with the semiconductor body 10, e.g., in a field free area, and may thereby electrically connect with the second load terminal 12. For example, the second contact 121 is a drain ring of the termination structure 18.

The second of the electrical potentials may be constituted by one of the electrical potential of the first load terminal 11 and the electrical potential of a control terminal (not illustrated), the latter being electrically connected to the control electrodes 132 of the power cells 14. For example, the semiconductor device 1 comprises at least one of the first contact 111 and a third contact 131, wherein each of these contacts 111 and 131 may be arranged above the surface 10-1 and within the termination structure 18. The first contact 111 may be configured to provide the electrical potential of the first load terminal 11. The third contact 131 may be configured to provide the electrical potential of the control electrode 132. Thus, in an embodiment, the electrical potential of the first load terminal 11 and/or the electrical potential of the control electrodes 132 may be provided at the front side of the semiconductor device 1. The semiconductor device 1 may comprise an electrical connection (not illustrated) that electrically connects the first load terminal 11 with the first contact 111 and/or an electrical connection (not illustrated) that electrically connects the control electrodes 132 with the third contact 131.

Further, now referring also to FIGS. 2-5, the termination structure 18 may comprise one or more doped semiconductor regions 181, 182, 183, 184 included in the semiconductor body 10, wherein the ohmic layer 17 may laterally overlap with at least one of these doped semiconductor regions.

For example, in accordance with the embodiments schematically illustrated in FIGS. 2-3, there may be arranged, along a direction from the active region 16 to the termination structure 18, a first semiconductor region 181, a second semiconductor region 182, and a third semiconductor region 183. In an embodiment, at least the second semiconductor region 182 may laterally overlap with the ohmic layer 17.

For example, the first semiconductor region 181, which may also be included in accordance with the embodiments schematically illustrated in FIGS. 4-5, can be arranged below the body region 102 and may comprise dopants of the second conductivity type. The first semiconductor region 181 may be electrically contacted to the first load terminal 11 and may extend along the extension direction Z, e.g., about as far or little further as the trenches that include the control electrodes 132. The first semiconductor region 181 may laterally overlap with the first load terminal 11 and a control signal runner 133 that may be electrically connected to the control electrodes 132.

In an embodiment, the second semiconductor region 182 also comprises dopants of the second conductivity type. Further, the second semiconductor region 182 may exhibit junction termination extension (JTE) configuration, e.g., a variation of the lateral dopant concentration (VLD) configuration. For example, the dopant concentration of the second semiconductor region 182 varies in the lateral direction, e.g., the dopant concentration may decrease along the first lateral direction X. In an embodiment, the dopant concentration of the second semiconductor region 182 is lower as compared to the dopant concentration of the first semiconductor region 181.

Each of the first semiconductor region 181 and the second semiconductor region 182 may be spatially displaced from the isolation layer 152 in the extension direction Z, e.g., by means of an oxide block 154 of the termination structure 18.

Below the insulation block 154 and separately from the second semiconductor region 182, there may be arranged a third semiconductor region 183 having dopants of the first or the second conductivity type, e.g., at a higher dopant concentration as the drift region 100. For example, this third semiconductor region 183 can be a channel stopper region. The third semiconductor region 183 may laterally overlap with the second contact 121 that provides the electrical potential of the second load terminal 12. In an embodiment, the third semiconductor region 183 may be electrically connected to the second contact 121.

Figure 4:
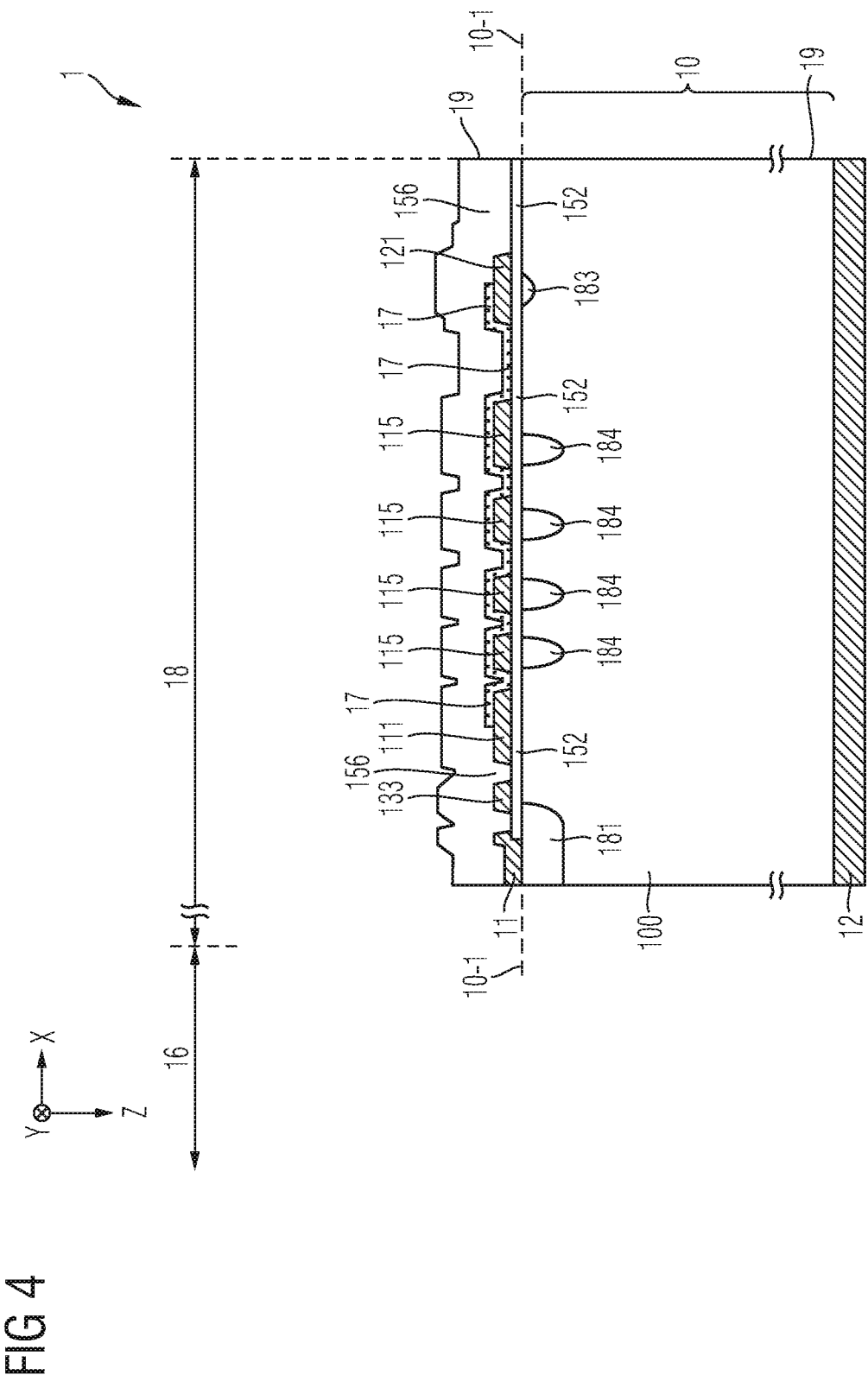
Figure 5:
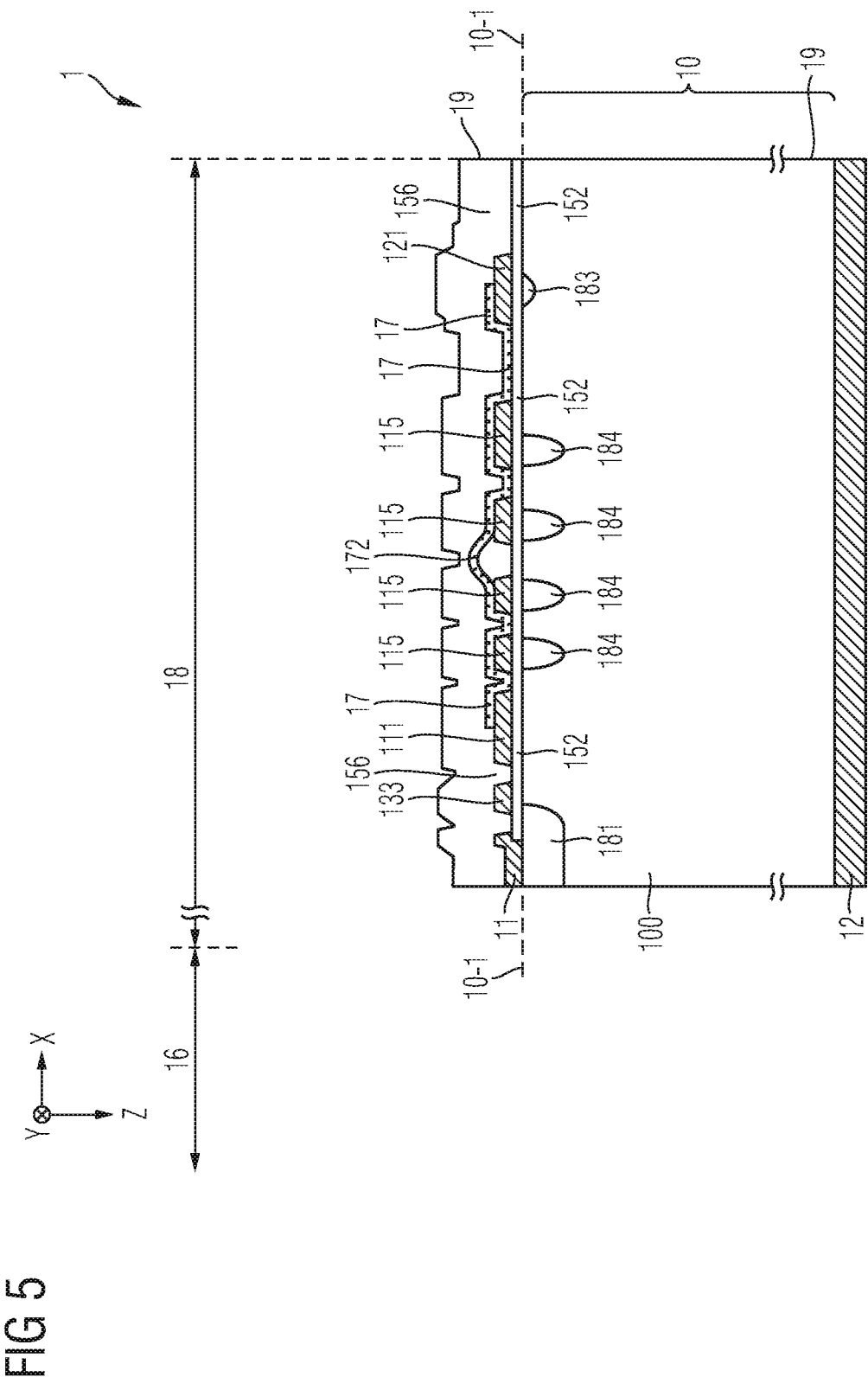

In accordance with the embodiments schematically illustrated in FIGS. 4 and 5, the termination structure 18 may comprise one or more fourth semiconductor regions 184. For example, the fourth semiconductor regions 184 are implemented as so-called guard rings that may each comprise dopants of the second conductivity type, wherein the guard rings 184 may be arranged separately from each other along the first lateral direction X. Further, the guard rings may laterally overlap with the ohmic layer 17. In an embodiment, the guard rings 184 are provided as an alternative to the second semiconductor region 182 which may form a contiguous semiconductor region and may exhibit, as has been illustrated above, a VLD configuration.

Before describing further exemplary features of the termination structure 18 and its ohmic layer 17, further optional aspects of the exemplary embodiments illustrated in FIGS. 2 to 5 shall be elucidated:

In accordance with the embodiments schematically illustrated in FIG. 2, the power cells 14 may exhibit a trench configuration, wherein the control electrodes 132 are arranged within the trenches and are isolated from the semiconductor body by means of a respective insulation 155, which may simultaneously form trench bottoms and trenches sidewalls. The first load terminal 11, and also the first contact 111 and the control signal runner 133 may be spatially displaced from the semiconductor body 10, e.g., from its surface 10-1, along the extension direction Z, e.g., by means of the isolation layer 152. Further, an encapsulation 156 can be provided, which may comprise or, respectively, be made of imide. For example, the encapsulation 156 extends against the extension direction Z, e.g. so as to entirely surround the second contact 121, the ohmic layer 17, the first contact 111, the control signal runner 133 in the first load terminal 11, in accordance with an embodiment (cf. also FIGS. 4-5). For example, the electrical connection between the first load terminal 11 and the semiconductor body region 102 and the semiconductor source regions 101 may be provided by means of small contact grooves or, respectively small contact plugs that extend along the extension direction Z, as schematically and exemplarily illustrated in FIG. 2. In accordance with the embodiment of FIG. 2, the ohmic layer electrically connects the second contact 121 with the first contact 111, the second contact 121 providing the electrical potential of the second load terminal 12 (e.g. of the back side metallization) and the first contact 111 providing the electrical potential of the first load terminal 11 (e.g. the front side metallization). For example, the first contact 111 and the second contact 121 are arranged at a lateral distance D1 to each other.

The embodiment schematically and exemplarily illustrated in FIG. 3 may almost be identical to the embodiment of FIG. 2, the difference including that the ohmic layer 17 electrically connects the second contact 121 with the third contact 131, the third contact 131 providing the electrical potential of the control electrodes 132. For example, the first contact 111 and the third contact 131 are arranged at a lateral distance D2 to each other In accordance with the embodiments schematically illustrated in FIGS. 4 and 5, instead of the second semiconductor region 182, there are provided the guard rings 184. For example, the termination structure 18 may further comprise one or more field plates 115. Each of the field plates 115 may laterally overlap with the respective one of the guard rings 184. In an embodiment, the field plate 115 laterally overlapping with one of the guard rings 184 may also be electrically connected thereto. As illustrated, the ohmic layer 17 may cover the provided field plates 115 along its course from the first contact 111 to the second contact 121.

Whereas the ohmic layer 17 may be configured for symmetrizing an electric field, at least within that section of the semiconductor body 10 that forms a part of the termination structure 18, it may also provide for a current path due to the ohmic connection it forms between the contacts 121 and 111 or, respectively, 131, which may increase a leakage current during a blocking state of the power semiconductor device, e.g., during presence of a comparably high voltage between the first load terminal 11 and the second load terminal 12 or, respectively, during presence of a comparably high voltage between the control electrodes 132 (which may exhibit an electrical potential close to the electrical potential of the first load terminal 11).

Now referring to all embodiments described herein, the ohmic layer 17 may be laterally structured along the ohmic connection it forms between the second contact 121 and one of the first contact 111 and the third contact 131.

For example, the laterally structured ohmic layer 17 may allow for increasing the ohmic resistance between the two contacts, thereby decreasing the leakage current. In accordance with an embodiment, the increase in ohmic resistance of the ohmic layer 17 is not, at least not only, achieved by post-processing the ohmic layer material 17, e.g., by a high temperature annealing and/or by implanting impurities or the like, but by laterally structuring the ohmic layer 17 along the ohmic connection, i.e., between the two contacts 121 and 111/131.

In an embodiment, the ohmic connection formed by the laterally structured ohmic layer 17 exhibits an ohmic resistance within a specific value range. For example, the ohmic resistance is formed—in terms of its magnitude—so as to fulfill at least two conditions. On the one side, a minimum value of the ohmic resistance can be chosen such that power losses caused by a leakage current between the two contacts 111/131 and 121 is kept below a threshold value, e.g., below 1 W, or below 0.1 W or below 50 mW when the blocking voltage is applied between the two load terminals 11 and 12. For example, the minimum value of the ohmic resistance of the ohmic layer 17 may be adjusted in dependence of the blocking voltage for which the power semiconductor device 1, i.e., its one or more power cells 14, is/are designed. For example, the higher the blocking voltage, the higher the minimum value of the ohmic resistance of the ohmic layer 17. On the other side, the ohmic layer 17 may be configured to provide for a suitable distribution of the electrical potential along the ohmic connection, wherein such function may limit a maximum value of the ohmic resistance of the ohmic layer 17. Given the wide range of blocking voltages for which power semiconductor devices may be designed, the range of the ohmic resistance of the ohmic layer 17 may be correspondingly wide. For example, the ohmic resistance of the ohmic layer 17 may be within the range of 100 kΩ to 100 GΩ, within the range of 10 MΩ to 100 GΩ, or within the range of 100 MΩ to 100 GΩ, or within the range of 1 GΩ to 10 GΩ.

As has been pointed out above, in an embodiment, the ohmic resistance of the ohmic layer 17 is adjusted by means of laterally structuring the ohmic layer 17 between the ohmic connection it forms between the two contacts 111/131 and 121.

In an embodiment, the laterally structured ohmic layer 17 exhibits a thickness in the extension direction the range of 10 nm to 10 µm, within the range of 100 nm to 1 µm, or within the range of 100 nm to 500 nm.

In accordance with an embodiment, due to the lateral structure of the ohmic layer 17, the ohmic connection formed by the laterally structured ohmic layer 17 may exhibit a length at least 1.3 times as long as the lateral distance between the respective two contacts 121 and 111/131. For example, referring to the embodiment in accordance with FIG. 2, the ohmic connection may exhibit a length that amounts to at least 1.3 times the distance D1 between the first contact 111 and the second contact 121. Referring to the embodiment in accordance with FIG. 3, the ohmic connection may exhibit a length that amounts to at least 1.3 times the distance D2 between the second contact 121 and the third contact 131. This factor may be greater than 1.3, e.g., the factor may amount to at least two, at least three or the factor may even amount to at least five, ten or even at least twenty.

With respect to the embodiments schematically illustrated in FIGS. 8 to 15, some exemplary and non-limiting manners of laterally structuring the ohmic layer 17 shall be described. Each of these non-limiting examples may be applied to the embodiments schematically illustrated in FIGS. 1 to 7, where the lateral structure of the ohmic layer 17 is not illustrated.

In an embodiment, the lateral structure of the ohmic layer 17 is realized by means of a plurality of insulator regions 171. In other words, the termination structure 18 may comprise the plurality of insulator regions 171 that constitute the lateral structure of the ohmic layer 17. For example, the plurality of insulator regions 171 may comprise or, respectively be formed by recesses of the ohmic layer 17. For example, in terms of a processing method, exemplary embodiments of which are described further below, the ohmic layer 17 may be provided above the surface 10-1 by means of depositing an ohmic layer material, e.g., one of amorphous silicon and SIPOS, and by using a mask and local removal of the ohmic layer. Accordingly, the created ohmic layer 17 may exhibit some openings which may be filled, within subsequent processing steps, an insulator material, thereby forming the plurality of insulator regions 171. The plurality of insulator regions 171 may constitute the lateral structure of the ohmic layer 17.

Figure 8:
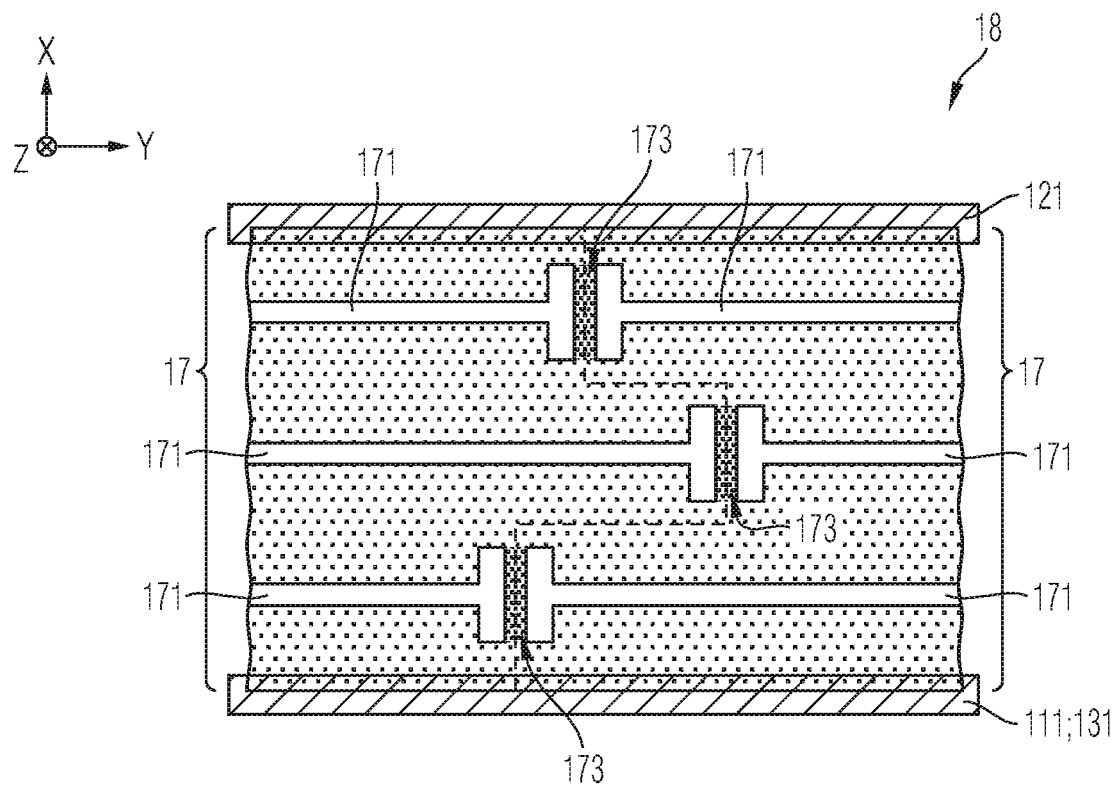
FIGS. 8-15 each schematically and exemplarily illustrate a section of a horizontal projection of a laterally structured ohmic layer of a power semiconductor device in accordance with one or more embodiments.
Figure 9:
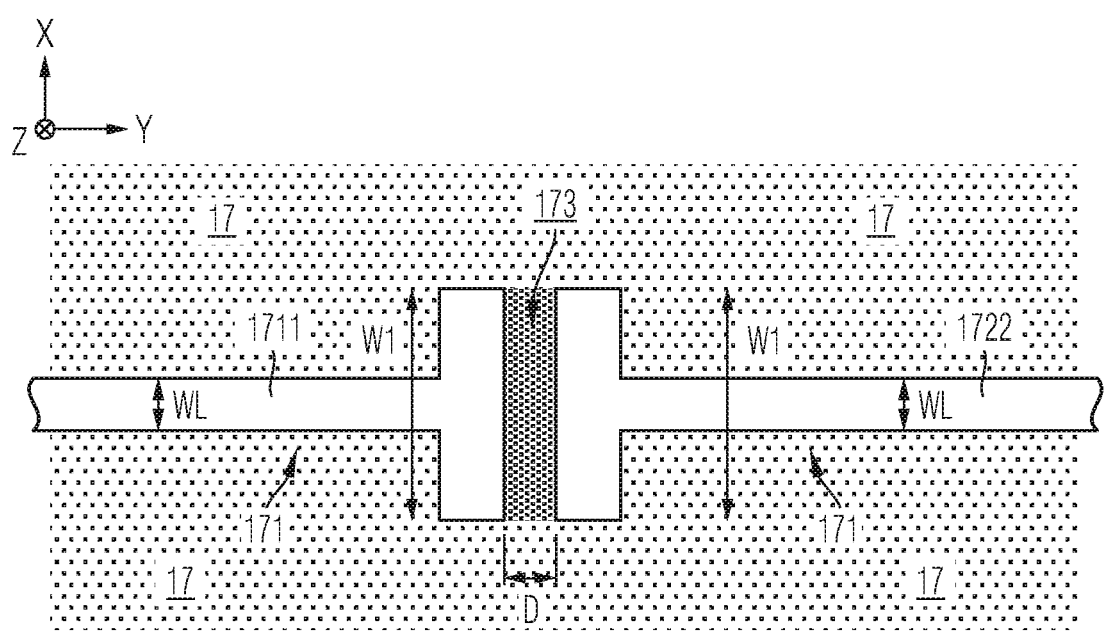

For example, regarding the embodiments schematically illustrated in FIGS. 8 and 9, the ohmic layer 17 is interrupted by the insulator regions 171. As illustrated by means of the dashed line, the (leakage) current between the second contact 121 and the other contact (either the first contact 111 or the third contact 131) has no possibility to take the direct path between the contacts 121 and 111/131, but must traverse along the course given by the current gates 173 that are defined by the insulator regions 171. The current gates 173 of the ohmic layer 17 are illustrated by means of the closely dotted areas in FIGS. 8 and 9, whereas the remaining regions of the ohmic layer 17 is illustrated by the regularly dotted areas. The course of the leakage current is significantly longer as the distance between the two contacts 121 and 111/131 and, in addition, the lateral structure 17 exhibits one or more locally increased resistances caused by the narrow current gates 173.

In an embodiment, the ohmic layer 17 may exhibit a total volume. The plurality of insulator regions 171 may spatially confine at least one current gate 173 of the ohmic layer. The at least one current gate 173 may exhibit a volume amounting to less than a 10% share of the total volume of the ohmic layer 17. This share can be even smaller than 10%, e.g., smaller than 5%, smaller than 3% or even smaller than 1%. The current path (cf. dashed line in FIG. 8) between the contacts 121 and 111/131 traverses the at least one current gate 173.

Accordingly, in an embodiment, the increased ohmic resistance of the ohmic layer 17 is achieved by the lateral structure, and not, at least not only, by processing the material of the ohmic layer 17. Of course, the present embodiments do not exclude that the material of the ohmic layer 17 is post-processed after having been deposited.

For example, the plurality of insulator regions 171 include at least a first insulator 1711 with a first end and a second insulator 1712 with a second end facing to the first end. Each of the ends may exhibit a flange shape, as illustrated in FIG. 8. For example, a respective current gate 173 may be spatially confined in such manner. For example, the two ends are arranged at a distance D to each other, wherein each of the flanges may exhibit a width W1, which may be greater as the width W2 of their respective lateral extensions. Accordingly, the volume of the current gate 173 may be defined by the product of the width W1, the distance D and the thickness of the ohmic layer 17. In an embodiment, the ratio between the distance D and the width W1 may be proportional to the ohmic resistance of the current path between the two contacts 121 and 111/131.

For example, due to the small current gates 173, a major part of the area between the two contacts 121 and 111/131 may be covered by the ohmic layer 17, while the ohmic resistance of the ohmic connection formed by the ohmic layer 17 between the two contacts 121 and 111/131 can simultaneously be comparatively high.

Other examples of the lateral structure of the ohmic layer 17 will now be explained with respect to the remaining drawings. Generally speaking, the plurality of insulator regions 171 may be spatially distributed so as to avoid large voltage drops along the distance between the two contacts 121 and 111/131. For example, this may be achieved by keeping the spatial displacement along the distance between respective two neighbored insulator regions 171 comparatively small. Further, the plurality of insulator regions 171 may also be distributed so as to ensure that critical regions of the termination structure 18 are covered by the ohmic layer 17, e.g. so as to ensure that counter charge in the ohmic layer 17 is present at critical regions, e.g., at an lateral end section of the second semiconductor region 182.

Figure 10:
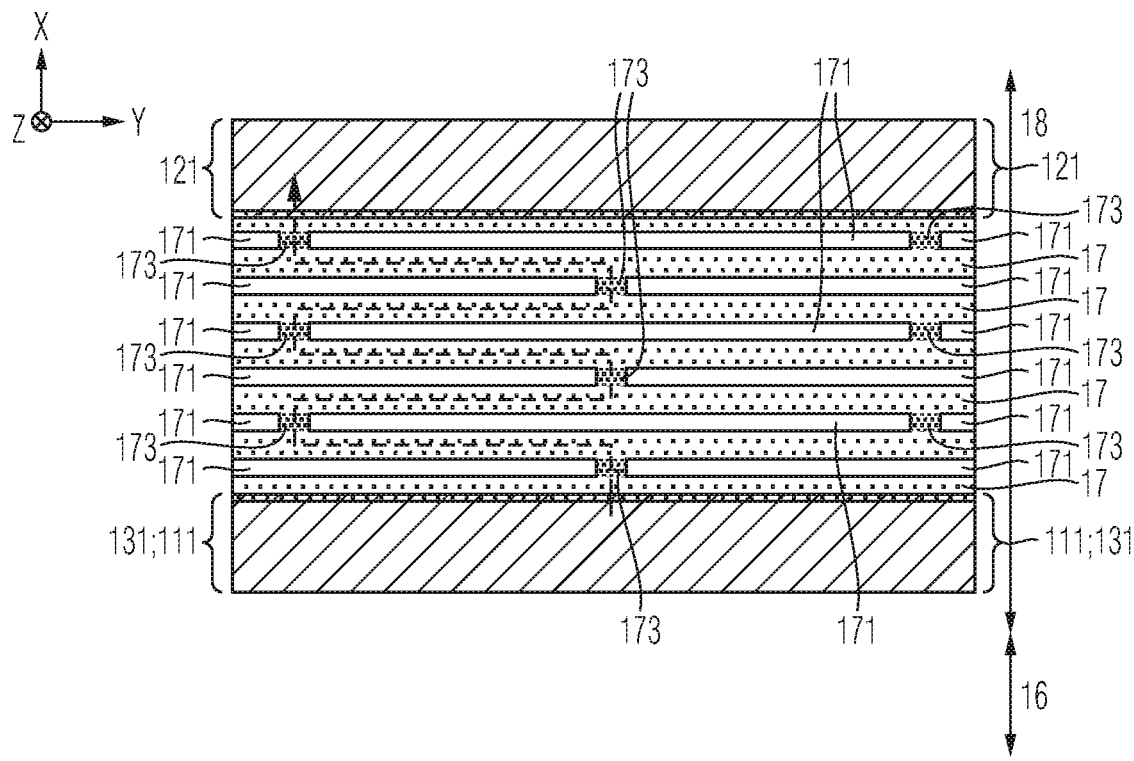

For example, referring to FIG. 10, each of the plurality of insulator regions 171 may exhibit a horizontal cross-section with a substantially rectangular shape, wherein the insulator regions 171 are laterally displaced from each other, e.g., such that the formed current gates 173 are not arranged along a straight line, but also laterally displaced from each other such that the current between the two contacts 121 and 111/131 has to follow a meander like path, as exemplarily illustrated by the dashed line. Thus, the ohmic connection formed by the ohmic layer 17 exhibits a length amounting to a least a multiple of the distance between the two contacts 121 and 111/131.

Figure 11:
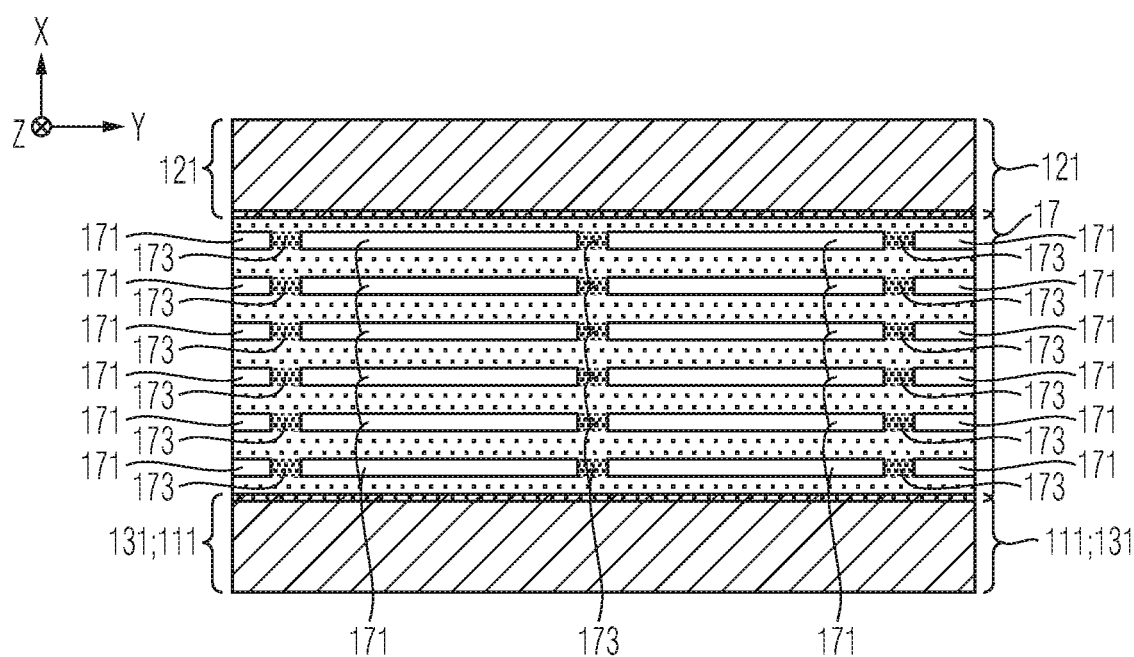
Figure 12:
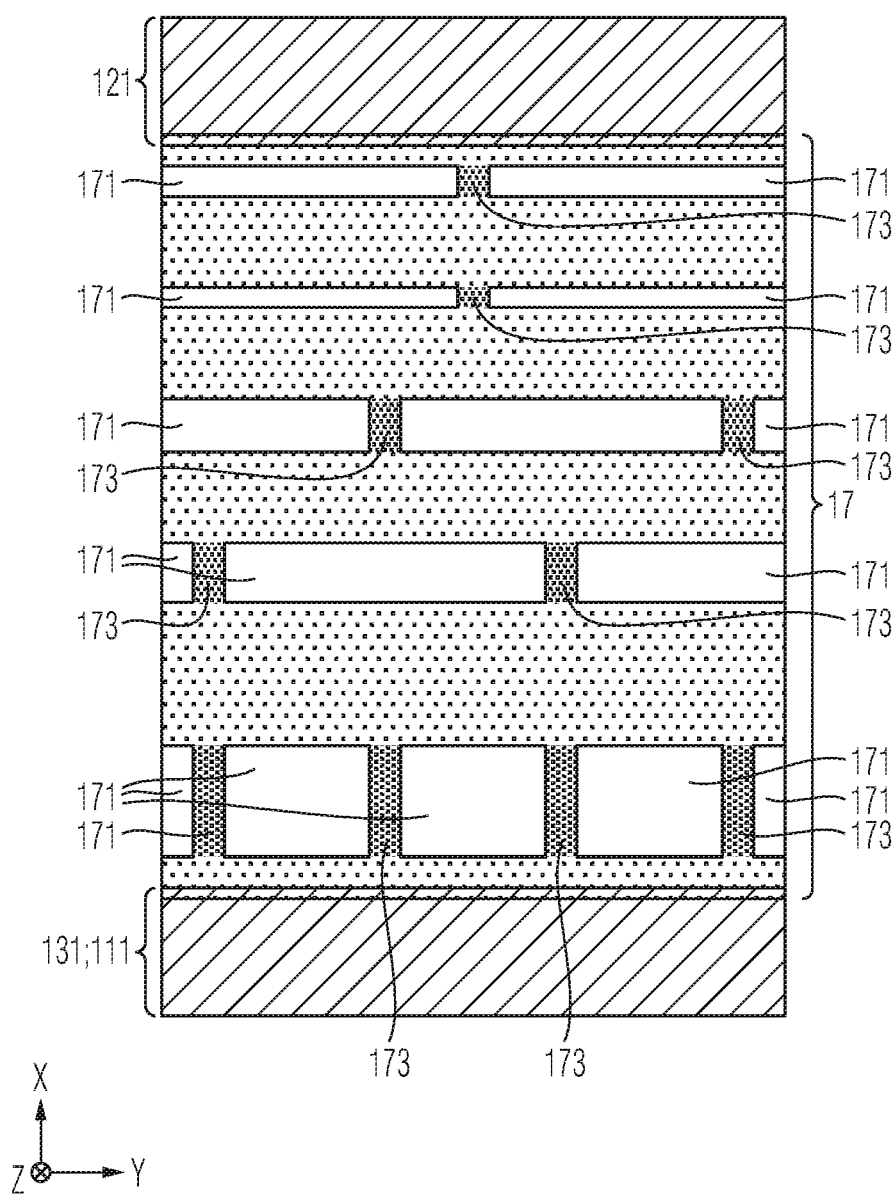

In another example that is schematically illustrated in FIG. 11, the current gates 173 may be arranged along a straight line, which may allow using a simply structured mask when laterally structuring the ohmic layer 17. Still, the plurality of insulator regions 171 laterally confine the course of the ohmic connection between the two contacts 121 and 111/131.

For example, the embodiments in accordance with FIGS. 10 and 11 are employed if the termination structure 18 comprises the second semiconductor region 182 that may exhibit JTE, e.g., a VLD configuration.

Figure 13:
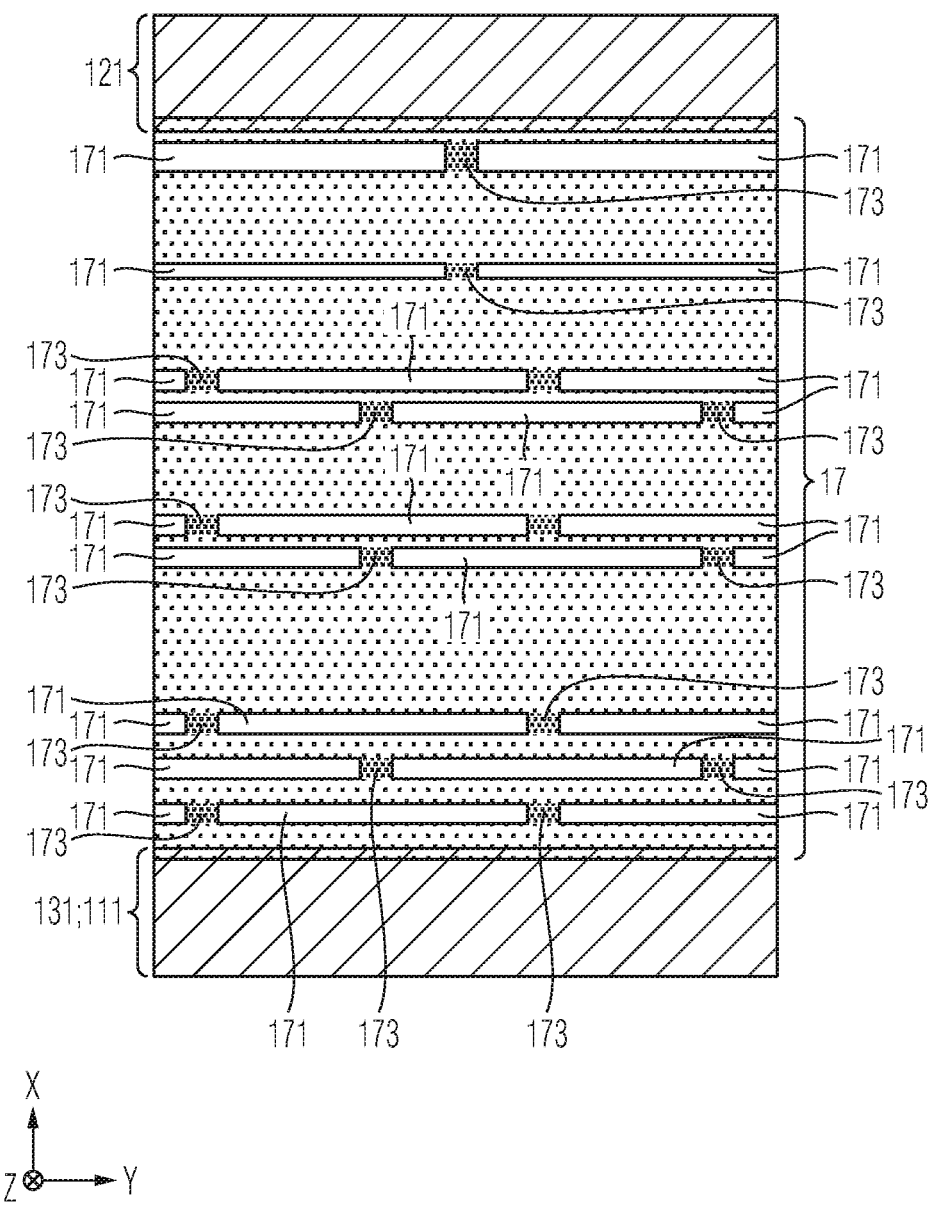
Figure 14:
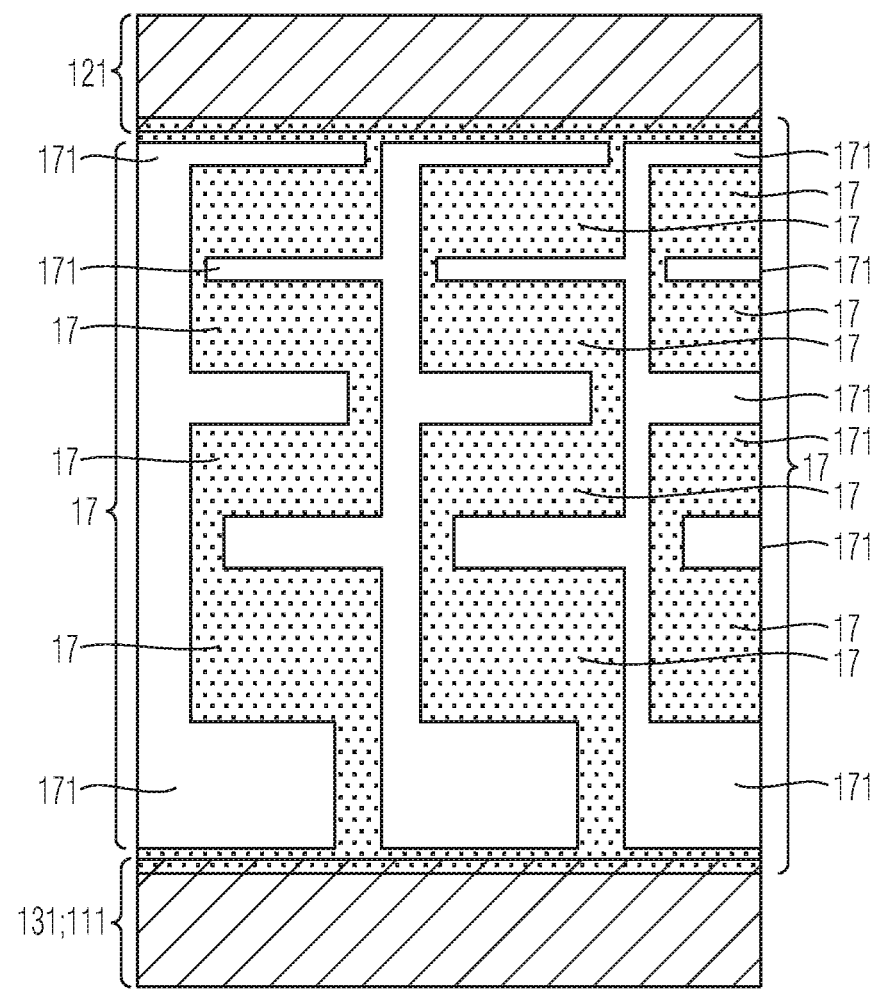

For example, the embodiments in accordance with the remaining FIGS. 12 to 15 can be employed if the termination structure 18 comprises the guard rings 184. In accordance with the embodiment illustrated in FIG. 12, some current gates 173 may be arranged along a straight line, whereas other current gates 173 are not arranged along a straight line. For example, the length (e.g. along the current direction) of the current gates 173 may be proportional to the widths (e.g. perpendicular to the current direction) of the insulator regions 171 which spatially confine the respective current gate 173. Another example of the spatial distribution of the plurality of insulator regions 171 is illustrated in FIGS. 13 and 14.

Figure 15:
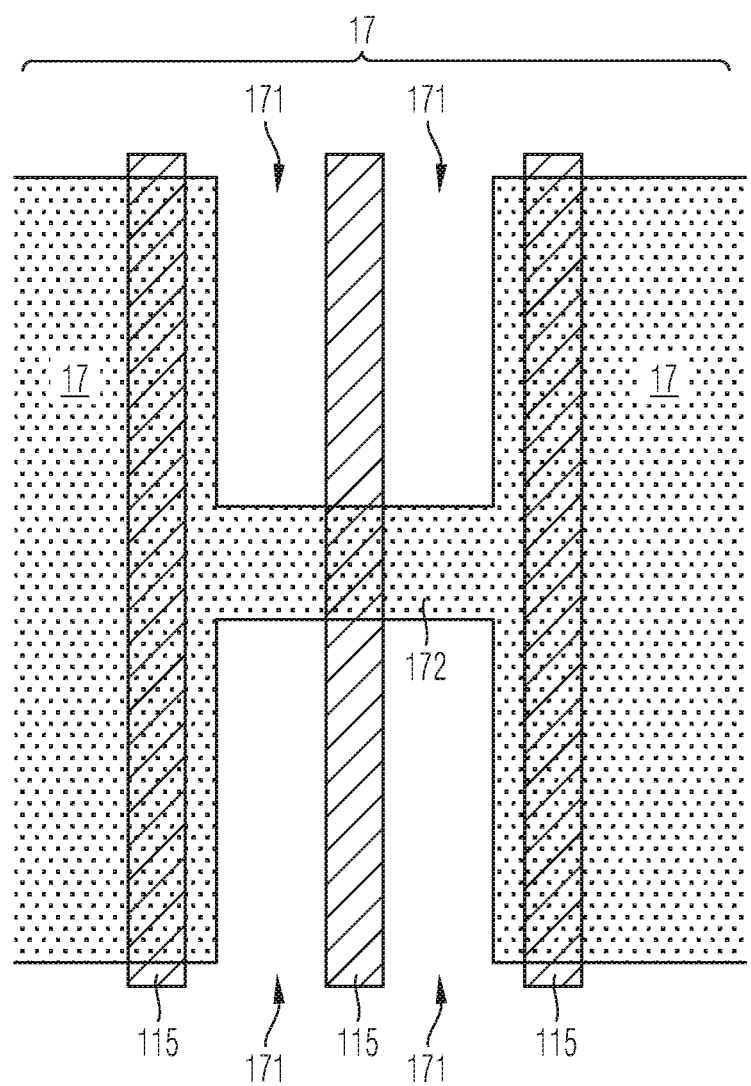

Further, referring to the embodiment in accordance with FIG. 15, the ohmic layer 17 may comprise at least one ohmic bridge 172 that has a greater distance to the surface 10-1 (along the extension direction Z) as compared to the insulator regions 171 and that bridges at least one of the plurality of insulator regions 171. This optional aspect is also schematically illustrated in FIG. 5. For example, if the termination structure 18 comprises the guard rings 184 and the field plates 115, the insulator regions 171 may be placed such that at least one of the field plates 115 is not entirely covered by the ohmic layer 17. Instead, the insulator regions 171 cover the major part of the respective field plate 115 and the field plate 115 is bridged by the ohmic bridge 172, which may simultaneously form a current gate.

In accordance with another embodiment, a method of processing a power semiconductor device is presented. The power semiconductor device 1 to be processed comprises a semiconductor body 10 coupled to a first load terminal 11 and a second load terminal 12 and including a drift region 100 with dopants of a first conductivity type; an active region 16 having at least one power cell 14 that extends at least partially into the semiconductor body 10 and that is electrically connected with the first load terminal 11 and that comprises a part of the drift region 100, the at least one power cell 14 comprising a section of the drift region 100 and being configured to conduct a load current between the terminals 11, 12 and to block a blocking voltage applied between the terminals 11, 12; a chip edge 19 that laterally terminates the semiconductor body 10; and a non-active termination structure 18 arranged in between the chip edge 19 and the active region 16. The method comprises: creating, above a surface 10-1 of the semiconductor body 10, an ohmic layer 17 in the termination structure 18, thereby forming an ohmic connection between an electrical potential 111 of the first load terminal 11 and an electrical potential 121 of the second load terminal 12, wherein forming the ohmic layer 17 includes structuring the ohmic layer 17 along the ohmic connection.

In accordance with a further embodiment, a further method of processing a power semiconductor device is present. The power semiconductor device 1 to be processed comprises a semiconductor body 10 coupled to a first load terminal 11 and a second load terminal 12 and including a drift region 100 with dopants of a first conductivity type; an active region 16 having at least one power cell 14 that extends at least partially into the semiconductor body 10 and that is electrically connected with the first load terminal 11 and that comprises a part of the drift region 100, the at least one power cell 14 comprising a section of the drift region 100 and being configured to conduct a load current between the terminals 11, 12 and to block a blocking voltage applied between the terminals 11, 12, wherein the at least one power cell 14 comprises a control electrode 132 electrically insulated from each of the load terminal 11, 12 and configured to control operation of the at least one power cell 14; a chip edge 19 that laterally terminates the semiconductor body 10; and a non-active termination structure 18 arranged in between the chip edge 19 and the active region 16. The method comprises: creating, above a surface 10-1 of the semiconductor body 10, an ohmic layer 17 in the termination structure 18, thereby forming an ohmic connection between an electrical potential 111 of the control electrode 132 and an electrical potential 121 of the second load terminal 12, wherein forming the ohmic layer 17 includes structuring the ohmic layer 17 along the ohmic connection.

Embodiments of the methods described above may correspond to the embodiments of the power semiconductor device described above, e.g., with respect to the FIGS. 1-15, and as defined in the dependent claims. In so far, it is referred to the above.

For example, the ohmic layer 17 is structured by applying a mask and by carrying out an etch processing step, e.g. so as to form recesses in the ohmic layer 17 which may be filled by an insulating material, so as to form the insulator regions 171. Thus, in an embodiment, the ohmic layer 17 may in a first step be homogeneously (unstructured) deposited above the surface 10-1 of the semiconductor body 10 and then, within further processing steps, laterally structured. In contrast, post-processing of the ohmic layer 17 with respect to its material may be prevented, e.g., carrying out a high temperature annealing and/or a damage implantation or the like is not necessary, in accordance with an embodiment. Thus, in accordance with an embodiment, the ohmic resistance between the two contacts 121 and 111/131 can be adjusted by intelligently structuring the ohmic layer 17 and not, at least not only by processing the ohmic layer 17 so to as adjust its material specific resistivity value.

In the above, embodiments pertaining to semiconductor devices and to processing methods were explained. For example, these semiconductor devices are based on silicon (Si). Accordingly, a monocrystalline semiconductor region or layer, e.g., the semiconductor body 10, the drift region 100, the region 181 to 184, the source region 101, the body region 102 of exemplary embodiments, can be a monocrystalline Si-region or Si-layer. In other embodiments, polycrystalline or amorphous silicon may be employed.

It should, however, be understood that the semiconductor body 10, the drift region 100, the region 181 to 184, the source region 101, the body region 102 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (Sic) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
   a semiconductor body coupled to a first load terminal and a second load terminal and including a drift region with dopants of a first conductivity type;
   an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals;
   a chip edge that laterally terminates the semiconductor body;
   a non-active termination structure arranged in between the chip edge and the active region and comprising an ohmic layer, a first semiconductor region and a second semiconductor region, each comprising dopants of a second conductivity type, wherein the first semiconductor region is electrically connected to the first load terminal and laterally overlaps therewith;
   wherein the ohmic layer:
   is made of amorphous silicon or semi-insulating polycrystalline silicon;
   is arranged above a surface of the semiconductor body;
   forms an ohmic connection between an electrical potential of the first load terminal and an electrical potential of the second load terminal;

laterally overlaps with the second semiconductor region; and is laterally structured along the ohmic connection.

2. The power semiconductor device of claim 1, wherein the electrical potential of the first load terminal is provided by a first contact, wherein the electrical potential of the second load terminal is provided by a second contact, and wherein each of the contacts is arranged in the termination structure and above the surface.

3. The power semiconductor device of claim 2, wherein the ohmic connection formed by the ohmic layer has a length at least 1.3 times as long as the lateral distance between the contacts.

4. The power semiconductor device of claim 1, wherein the ohmic connection has an ohmic resistance within the range of 1 GΩ to 10 GΩ.

5. The power semiconductor device of claim 1, wherein the ohmic layer is configured to form, with respect to charge present in the semiconductor body at least partially covered by the ohmic layer, a counter charge.

6. The power semiconductor device of claim 1, wherein the termination structure comprises one or more doped semiconductor regions included in the semiconductor body, and wherein the ohmic layer laterally overlaps with at least one of the one or more doped semiconductor regions.

7. The power semiconductor device of claim 1, wherein the termination structure is a high voltage termination structure.

8. The power semiconductor device of claim 1, wherein the first load terminal and the second load terminal vertically terminate the power semiconductor device.

9. The power semiconductor device of claim 1, wherein the termination structure comprises a plurality of insulator regions that constitute the lateral structure of the ohmic layer.

10. A power semiconductor device, comprising:
a semiconductor body coupled to a first load terminal and a second load terminal and including a drift region with dopants of a first conductivity type;
an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals, and wherein the at least one power cell comprises a control electrode electrically insulated from each of the load terminal and configured to control operation of the at least one power cell;
a chip edge that laterally terminates the semiconductor body;
a non-active termination structure arranged in between the chip edge and the active region and comprising an ohmic layer, a first semiconductor region and a second semiconductor region, each comprising dopants of a second conductivity type, wherein the first semiconductor region is electrically connected to the first load terminal and laterally overlaps therewith;
wherein the ohmic layer:
is made of amorphous silicon or semi-insulating polycrystalline silicon;
is arranged above a surface of the semiconductor body;
forms an ohmic connection between an electrical potential of the second load terminal and an electrical potential of the control electrode;

laterally overlaps with the second semiconductor region; and is laterally structured along the ohmic connection.

11. The power semiconductor device of claim 10, wherein the electrical potential of the second load terminal is provided by a second contact, wherein the electrical potential of the control electrode is provided by a third contact, and wherein each of the contacts is arranged in the termination structure and above the surface.

12. The power semiconductor device of claim 11, wherein the ohmic connection formed by the ohmic layer has a length at least 1.3 times as long as the lateral distance between the contacts.

13. The power semiconductor device of claim 10, wherein the termination structure comprises a plurality of insulator regions that constitute the lateral structure of the ohmic layer.

14. The power semiconductor device of claim 13, wherein the plurality of insulator regions laterally confine the ohmic connection between the contacts formed by the ohmic layer.

15. The power semiconductor device of claim 14, wherein the plurality of insulator regions laterally confine the ohmic connection between the contacts formed by the ohmic layer.

16. The power semiconductor device of claim 13, wherein the plurality of insulator regions comprise recesses of the ohmic layer.

17. The power semiconductor device of claim 13, wherein the plurality of insulator regions include a first insulator with a first end and a second insulator with a second end facing to the first end, each of the ends having a flange shape.

18. The power semiconductor device of claim 13, wherein the ohmic layer comprises at least one ohmic bridge that has a greater distance to the surface as compared to the insulator regions and that bridges at least one of the plurality of insulator regions.

19. The power semiconductor device of claim 13, wherein the ohmic layer has a total volume, wherein the plurality of insulator regions spatially confine at least one current gate of the ohmic layer, wherein the at least one current gate has a volume amounting to less than a 10% share of the total volume of the ohmic layer, and wherein a current path between the contacts traverses the at least one current gate.

20. A method of processing a power semiconductor device, wherein the power semiconductor device comprises a semiconductor body coupled to a first load terminal and a second load terminal and including a drift region with dopants of a first conductivity type; an active region having at least one power cell that extends at least partially into the semiconductor body and that is electrically connected with the first load terminal and that comprises a part of the drift region, the at least one power cell comprising a section of the drift region and being configured to conduct a load current between the terminals and to block a blocking voltage applied between the terminals; a chip edge that laterally terminates the semiconductor body; and a non-active termination structure arranged in between the chip edge and the active region, the non-active termination structure comprising a first semiconductor region and a second semiconductor region, each comprising dopants of a second conductivity type, wherein the first semiconductor region is electrically connected to the first load terminal and laterally overlaps therewith, the method comprising:
creating, above a surface of the semiconductor body, an ohmic layer in the termination structure, to form an ohmic connection between an electrical potential of the first load terminal and an electrical potential of the second load terminal, wherein forming the ohmic layer comprises structuring the ohmic layer along the ohmic connection,
wherein the ohmic layer is made of amorphous silicon or semi-insulating polycrystalline silicon and laterally overlaps with the second semiconductor region.

* * * * *